United States Patent
Shu et al.

(10) Patent No.: US 12,282,617 B2
(45) Date of Patent: Apr. 22, 2025

(54) TOUCH DISPLAY PANEL AND ELECTRONIC EQUIPMENT

(71) Applicant: WUHAN CHINA STAR OPTOELECTRONICS SEMICONDUCTOR DISPLAY TECHNOLOGY CO., LTD., Wuhan (CN)

(72) Inventors: Min Shu, Wuhan (CN); Yu Zhao, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/433,992

(22) PCT Filed: May 31, 2021

(86) PCT No.: PCT/CN2021/097529
§ 371 (c)(1),
(2) Date: Aug. 25, 2021

(87) PCT Pub. No.: WO2022/241839
PCT Pub. Date: Nov. 24, 2022

(65) Prior Publication Data
US 2024/0019950 A1    Jan. 18, 2024

(30) Foreign Application Priority Data
May 19, 2021   (CN) .......................... 202110547899.9

(51) Int. Cl.
G06F 3/041       (2006.01)
H10K 59/131      (2023.01)
(Continued)

(52) U.S. Cl.
CPC ........ *G06F 3/0412* (2013.01); *G06F 3/04164* (2019.05); *H10K 59/131* (2023.02);
(Continued)

(58) Field of Classification Search
CPC ............... G06F 3/0412; G06F 3/04164; G06F 2203/04102; G06F 3/0443; G06F 3/0446;
(Continued)

(56) References Cited

U.S. PATENT DOCUMENTS

2017/0003786 A1    1/2017  Kim
2018/0059862 A1*   3/2018  Zeng .................... H10K 59/873

FOREIGN PATENT DOCUMENTS

CN    106803514 A    6/2017
CN    106951125 A    7/2017
(Continued)

OTHER PUBLICATIONS

Chinese Office Action issued in corresponding Chinese Patent Application No. 202110547899.9 dated Dec. 20, 2023, pp. 1-7.
(Continued)

*Primary Examiner* — Abhishek Sarma
(74) *Attorney, Agent, or Firm* — PV IP PC; Wei Te Chung

(57) ABSTRACT

A touch display panel and an electronic equipment are provided. The touch display panel includes a display area and a non-display area. The touch display panel also includes a touch function layer, a thin film transistor array layer, and an organic light emitting layer. Using a preparation process of the thin film transistor array layer, a touch wiring of the non-display area is formed on a same layer, which can solve a problem of poor etching of the touch wiring due to different substrate materials of a touch trace in the display area and the touch wiring in the non-display area.

19 Claims, 8 Drawing Sheets

(51) Int. Cl.
   *H10K 59/40*   (2023.01)
   *H10K 59/80*   (2023.01)
   *H10K 102/00*  (2023.01)

(52) U.S. Cl.
   CPC ........... *H10K 59/40* (2023.02); *H10K 59/873* (2023.02); *H10K 2102/311* (2023.02)

(58) Field of Classification Search
   CPC ........ G06F 2203/04103; H10K 59/131; H10K 59/40; H10K 59/873; H10K 2102/311
   See application file for complete search history.

(56) References Cited

FOREIGN PATENT DOCUMENTS

| | | | |
   |---|---|---|---|
   | CN | 110265409 | A | 9/2019 |
   | CN | 209641657 | U | 11/2019 |
   | CN | 112582381 | A | 3/2021 |
   | CN | 112768495 | A | 5/2021 |

OTHER PUBLICATIONS

Chinese Office Action issued in corresponding Chinese Patent Application No. 202110547899.9 dated Feb. 28, 2023, pp. 1-6.
   Chinese Decision of Rejection issued in corresponding Chinese Patent Application No. 202110547899.9 dated Jun. 25, 2023, pp. 1-4.
   Chinese Office Action issued in corresponding Chinese Patent Application No. 202110547899.9 dated Jun. 6, 2022, pp. 1-8.
   International Search Report in International application No. PCT/CN2021/097529, mailed on Jan. 27, 2022.
   Written Opinion of the International Searching Authority in International application No. PCT/CN2021/097529, mailed on Jan. 27, 2022.

* cited by examiner

TOUCH DISPLAY PANEL AND ELECTRONIC EQUIPMENT

RELATED APPLICATIONS

This application is a Notional Phase of PCT Patent Application No. PCT/CN2021/097529 having international filing date of May 31, 2021, which claims the benefit of priority of Chinese Patent Application No. 202110547899.9 filed on May 19, 2021. The contents of the above applications are all incorporated by reference as if fully set forth herein in their entirety.

FIELD OF DISCLOSURE

The present disclosure relates to the field of display technologies, in particular to a touch display panel and an electronic equipment.

BACKGROUND

A DOT (direct on cell touch, directly forming a touch layer on an encapsulation layer) technology is an encapsulating touch integration technology, which directly integrates a touch function layer on the encapsulation layer without adding an additional external touch layer. The DOT technology has better transmittance and bending resistance, and a thickness of a screen can be effectively reduced, thereby decreasing product costs.

In current DOT technology, it is necessary to form an organic light emitting layer, an encapsulation layer, and a touch function layer in sequence. In order to prevent adverse effects on the organic light emitting layer due to high temperature film formation in the DOT process, the high-temperature film forming process is generally not employed to form touch electrodes and touch traces in the touch function layer. Specifically, substrate material of the touch traces in the touch function layer is an inorganic encapsulation layer. Substrate material of touch wirings in a non-display area is an organic layer. Therefore, during an etching process of the touch electrodes and touch traces, adjacent touch electrodes and/or touch traces are easily deformed or slumped or even short-circuited.

It should be noted that the above introduction of the background is only for the convenience of clarity and a complete understanding of technical solutions of the present disclosure. Therefore, it should not be considered that the technical solutions mentioned above are known to those skilled in the art just because they appear in the background of the present disclosure.

SUMMARY OF DISCLOSURE

The present disclosure provides a touch display panel and an electronic equipment, which solve the technical problem that a touch structure is easily etched poorly during an etching process.

In a first aspect, the present disclosure provides a touch display panel. The touch display panel further includes a substrate, a thin film transistor array layer, an organic light emitting layer, and a touch function layer. The thin film transistor array layer is disposed on the substrate and includes a plurality of thin film transistors. The organic light emitting layer is disposed in a display area and disposed on a side of the thin film transistors away from the substrate. The touch function layer disposed on a side of the organic light emitting layer away from the substrate. The touch function layer includes a touch electrode and a touch trace that are electrically connected, the touch electrode is disposed in the display area, and the touch trace extends along the display area to a non-display area. The thin film transistor array layer further includes a first metal layer, the first metal layer includes a first wiring disposed in the display area and a touch wiring disposed in the non-display area, the first wiring is electrically connected to the thin film transistor, and the touch wiring and the touch trace are electrically connected in the non-display area.

In one embodiment, the non-display area includes a first sub-bezel area, a bending area, and a second sub-bezel area that are sequentially arranged, and the first sub-bezel area is disposed between the display area and the bending area. The touch display panel further includes a retaining wall and an encapsulation layer. The retaining wall is disposed on a side of the thin film transistor array layer away from the substrate and disposed on the non-display area. The encapsulation layer is disposed between the organic light emitting layer and the touch function layer. The encapsulation layer covers the light emitting layer in the display area and extends to cover the retaining wall in the non-display area. The touch trace and the touch wiring are electrically connected through a via hole, and the via hole is formed between the retaining wall and the bending area.

In one embodiment, the thin film transistor array layer includes a first gate insulating layer, a first gate layer, a second gate insulating layer, a second gate layer, an interlayer insulating layer, a first source-drain layer, a first organic planarization layer, and a second source-drain layer that are disposed on a side of the substrate and are stacked layer by layer. The touch display panel further includes a second organic planarization layer, the second organic planarization layer is disposed between the thin film transistor array layer and the touch function layer, and the second source-drain layer is disposed far away from the substrate.

In one embodiment, the first metal layer is the second source-drain layer, the via hole extends through the second organic planarization layer, and the via hole is connected to the second source-drain layer and the touch function layer.

In one embodiment, the second source-drain layer includes a plurality of second source-drain wirings, and the first wiring is one of the second source-drain wirings.

In one embodiment, the first metal layer is the first source-drain layer, the via hole extends through the first organic planarization layer, the second source-drain layer, and the second organic planarization layer, and the via hole is connected to the first source-drain layer and the touch function layer.

In one embodiment, the first metal layer is the second gate layer, the via hole extends through the interlayer insulating layer, the first source-drain layer, the first organic planarization layer, the second source-drain layer, and the second organic planarization layer, and the via hole is connected to the second gate layer and the touch function layer.

In one embodiment, the first metal layer is the first gate layer, the via hole extends through the second gate insulating layer, the second gate layer, the interlayer insulating layer, the first source-drain layer, the first organic planarization layer, the second source-drain layer, and the second organic planarization layer, and the via hole is connected to the first gate layer and the touch function layer.

In one embodiment, at least one of the touch electrode, the touch trace, and the touch wiring includes a composite layer with Ti/Al/Ti material.

In a second aspect, the present disclosure provides an electronic equipment, including the touch display panel in any of the above embodiments.

In the touch display panel and the electronic equipment provided by the present disclosure, in a formation process of the thin film transistor array layer, the touch wiring of the non-display area is formed in the same layer, which solves the problem of poor etching of the touch wiring caused by different substrate materials of the touch trace in the display area and the touch wiring in the non-display area.

DETAILED DESCRIPTION

In order to make purposes, technical solutions, and effects of the present disclosure clearer and specific, the present disclosure will be further described in detail below with reference to the accompanying drawings and embodiments. It should be understood that the specific embodiments described herein are only used to explain the present disclosure, and are not used to limit the present disclosure.

Figure 1:
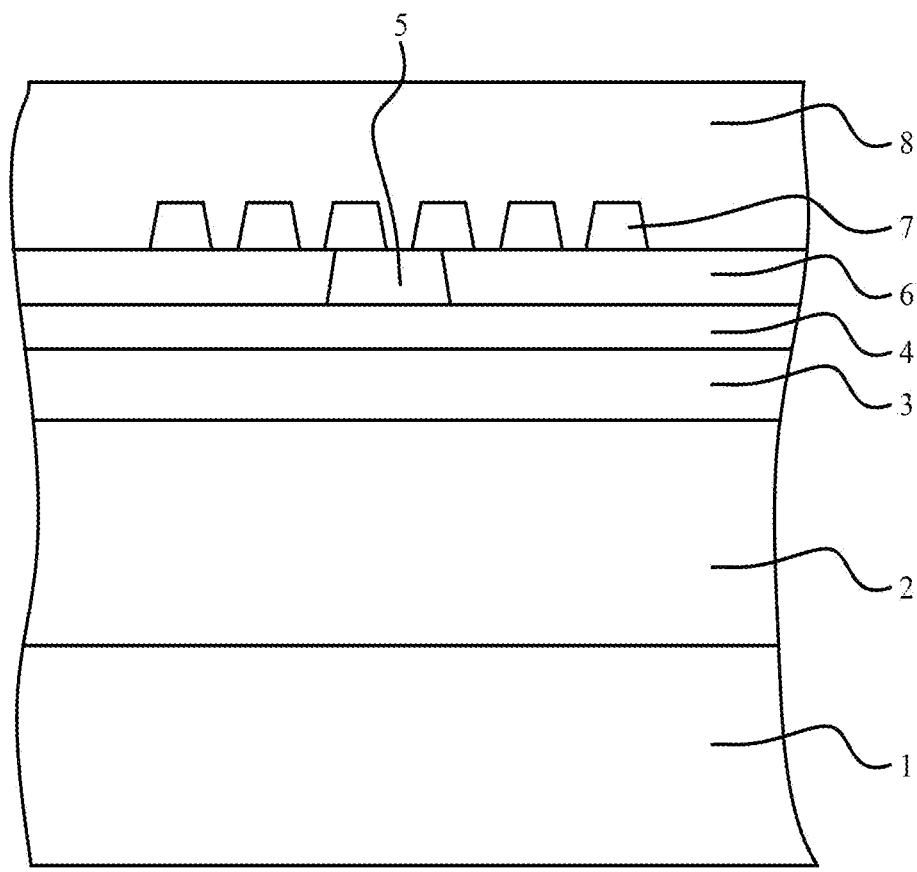
FIG. 1 is a schematic diagram of a touch display panel in a display area in the prior art.
Figure 2:
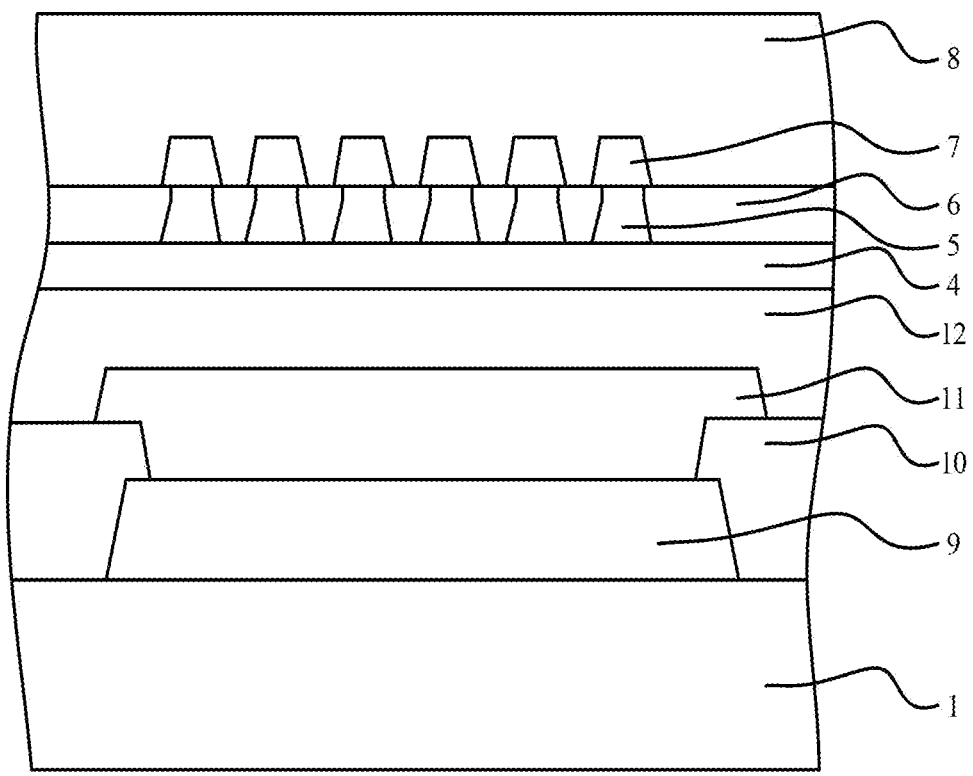
FIG. 2 is a schematic diagram of the touch display panel in a non-display area in the prior art.

As shown in FIG. 1 and FIG. 2, a touch display panel is provided with a first layer structure in a display area as shown in FIG. 1 and a second layer structure in a non-display area as shown in FIG. 2. In the display area, the first layer structure includes a first thin film transistor array layer 1, an organic light emitting layer 2, an encapsulation layer 3, a first touch function layer, and an organic insulating layer 8 which are disposed in layers. In the non-display area, the second layer structure includes the first thin film transistor array layer 1, a first drain-source layer 9, a first organic planarization layer 10, a second drain-source layer 11, a second organic planarization layer 12, the first touch function layer, and the organic insulating layer 8. It should be noted that the first touch function layer of the touch display panel extends from the display area to the non-display area, and is connected to a touch drive circuit.

Specifically, the first touch function layer includes a first interlayer insulating layer 4, an electrical bridging layer 5, a second interlayer insulating layer 6, and a touch electrode layer 7 which are sequentially stacked. The electrical bridging layer 5 is configured to bridge the cross but not electrically connected places in the touch electrode layer 7.

Figure 3:
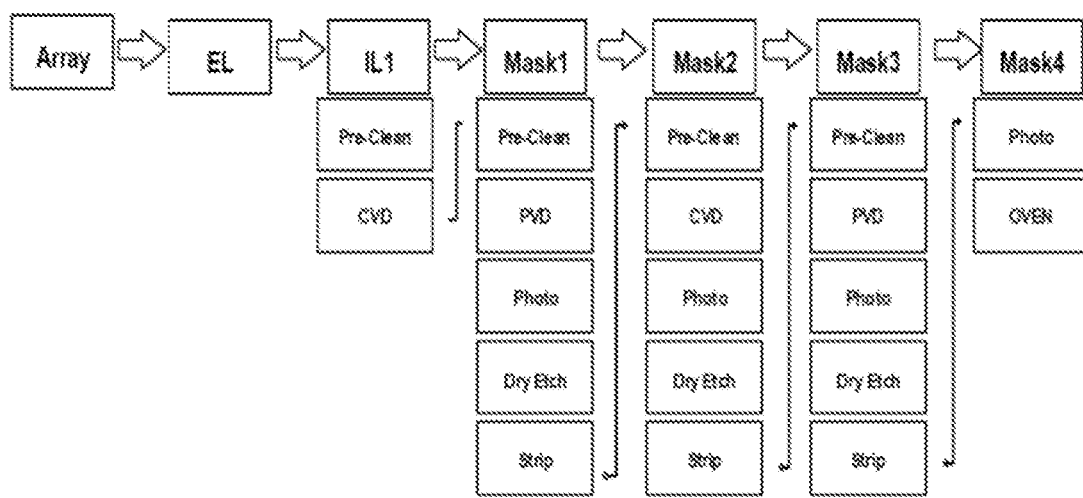
FIG. 3 is a flowchart of a manufacturing method of the touch display panel in the prior art.

As shown in FIG. 3, manufacturing processes of the touch display panel are as follows. First, the first thin film transistor array layer (Array) is generally formed, and then the organic light emitting layer (EL) and the encapsulation layer are formed. The first interlayer insulating layer is formed on the encapsulation layer through pre-cleaning (Pre-Clean) and chemical vapor deposition (CVD) processes in sequence. The electrical bridging layer is formed on the first interlayer insulating layer through pre-cleaning (Pre-Clean), physical vapor deposition (PVD), photolithography (Photo), dry etching (Dry Etch), and stripping (Strip) processes in sequence. The second interlayer insulating layer is formed on the electrical bridging layer through pre-cleaning (Pre-Clean), chemical vapor deposition (CVD), photolithography (Photo), dry etching (Dry Etch), and stripping (Strip) processes in sequence. The touch electrode is formed on the second interlayer insulating layer through pre-cleaning (Pre-Clean), physical vapor deposition (PVD), photolithography (Photo), dry etching (Dry Etch), and stripping (Strip) processes in sequence. The organic insulating layer is formed on the touch electrode layer through photolithography (Photo) and baking (OVEN) processes in sequence.

Based on the above, the touch display panel shown in FIG. 1 to FIG. 3, the first touch function layer is formed on/after the organic light emitting layer. At this time, metal layers of the electrical bridging layer and/or the touch electrode layer are generally form at a lower temperature, so that it can prevent adverse effects on the luminescent material in the organic light emitting layer due to high temperature. However, because the first touch function layer is form at a lower temperature, the toughness and/or strength of the formed metal is not as good as form at the high temperature. Therefore, in the process of etching the touch electrode and/or the touch wiring, the touch electrode and/or the touch wiring are prone to defects and deformation.

Figure 4:
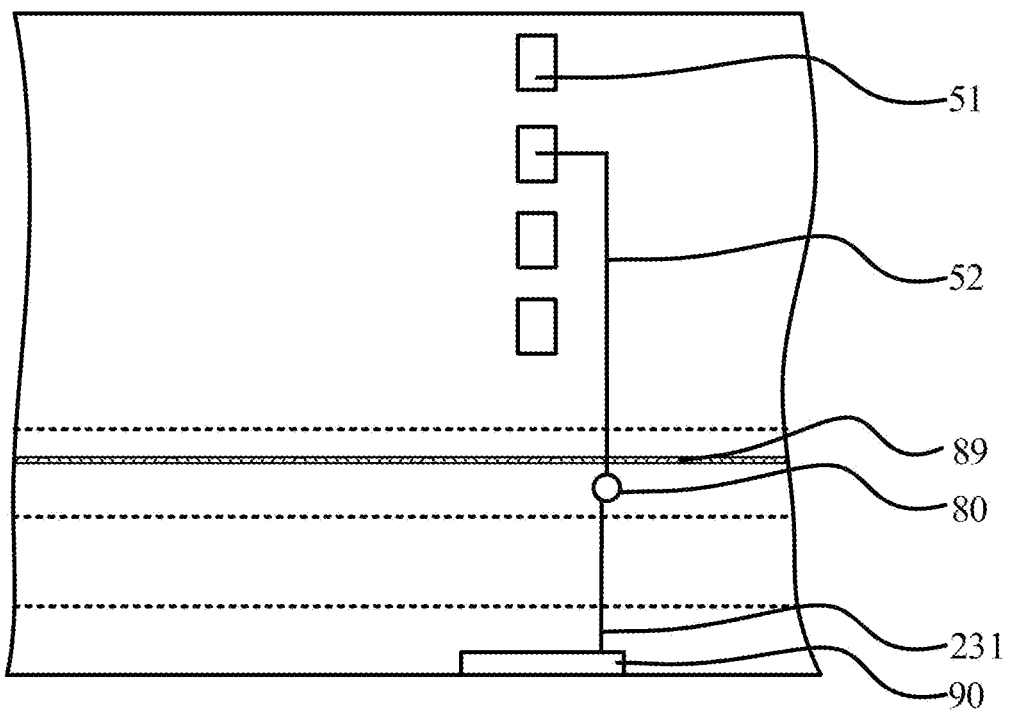
FIG. 4 is a plan view of a touch display panel of an embodiment of the present disclosure.

Based on this, refer to FIG. 4 to FIG. 8. As shown in FIG. 4, this embodiment provides a touch display panel. The touch display panel has a touch structure disposed in a display area and a non-display area. The touch structure includes a touch electrode 51, a touch trace 52, and a touch wiring 231. The touch trace 52 is connected to the touch electrode 51. The touch trace 52 is disposed on a touch function layer 50. The touch trace 52 extends along the display area to the non-display area. The touch wiring 231 is electrically connected to the touch trace 52. The touch wiring 231 is disposed in the first metal layer 23 of the non-display area. The first metal layer 23 is disposed in the thin film transistor array layer 20. In the display area, the touch display panel is provided with an organic light emitting layer 30. The organic light emitting layer 30 is disposed between the first metal layer 23 and the touch function layer 50.

It can be understood that the touch display panel in this embodiment can use the manufacturing process of the thin film transistor array layer 20 to form the touch wiring 231 of the non-display area in the same layer. Therefore, a problem of poor etching of the touch wiring 231 caused by the different substrate materials of the touch trace 52 in the display area and the touch wiring 231 in the non-display area is solved.

In one embodiment, the touch wiring 231 is formed through a high-temperature film forming process.

In one embodiment, the non-display area includes a first sub-bezel area, a bending area, and a second sub-bezel area which are arranged in sequence. The first sub-bezel area is disposed between the display area and the bending area. The touch trace 52 is disposed in the first sub-bezel area and/or the bending area. The touch wiring 231 is disposed in the second sub-bezel area and/or the bending area.

As shown in FIG. 4, in one embodiment, the touch display panel further includes an encapsulation layer 40 and a via hole 80. The encapsulation layer 40 extends from the display area to the first sub-bezel area, and forms a retaining wall 89 in the first sub-bezel area. The touch trace 52 is electrically connected to the touch wiring 231 through the via hole 80. The via hole 80 is disposed between the retaining wall 89 and the bending area.

It should be noted that because an extension of the encapsulation layer 40 is suddenly interrupted, a step is formed at the interruption of the encapsulation layer 40. This step is the retaining wall 89, which can prevent water and oxygen from invading. The via hole 80 is formed between the retaining wall 89 and the bending area, which can maximize a length of the touch wiring 231 and reduce a length of the touch trace 52. The length of the touch wiring 231 formed on the same layer as the thin film transistor array layer 20 will be larger.

In one embodiment, the touch structure further includes the via hole 80. The touch trace 52 is electrically connected to the touch wiring 231 through the via hole 80, and the via hole 80 is disposed in the first sub-bezel area.

It should be noted that the via hole 80 is disposed in the first sub-bezel area, which can maximize a transmission path of the touch wiring. A length of the touch structure subjected to the high-temperature film forming process can be further increased, and the length of the touch trace 52 can be shortened at the same time. Since the touch trace 52 is disposed on the organic light emitting layer 30, it is not convenient for the touch trace 52 to adopt the high-temperature film forming process. The length of the touch trace 52 is shortened, which can effectively reduce a risk of aluminum (Al) migration or Al corrosion.

It can be understood that the via hole 80 may be, but not limited to, disposed in the first sub-bezel area, and may also be disposed in the bending area. The via hole 80 can not only play a role of electrically connecting the touch trace 52 and the touch wiring 231, but also because the via hole 80 is formed in the bending area, it can buffer a bending stress formed by the bending area during a bending process, thereby increasing a bending performance of the bending area.

In one embodiment, at least one of the touch electrode 51, the touch trace 52, and the touch wiring 231 includes a composite layer with Ti/Al/Ti material.

It is understandable that the use of the composite layer with Ti (titanium)/Al (aluminum)/Ti material as a touch conductive material can enhance the bending performance, which is beneficial to the manufacture of foldable touch products. However, since the touch wiring 231 is provided in the first metal layer 23 in the non-display area, even if the high-temperature film forming process is adopted for this part of the touch wiring 231, a performance of a luminescent material in the organic light emitting layer 30 will not be affected. Therefore, the first metal layer 23 formed by the high-temperature film forming process will not undergo Al migration or Al corrosion during an etching process of the touch wiring 231. Specifically, during or after etching, Al is easily corroded by Cl (halide) ions, and once this corrosion occurs, it will continue to react. If this situation is serious, the corresponding touch wiring 231 may be hollowed out or collapsed, and the resulting product is not conductive.

As shown in FIG. 4, in one embodiment, the touch structure further includes a touch integrated circuit 90. The touch integrated circuit 90 is connected to the touch wiring 231. The touch integrated circuit 90 is disposed in the second sub-bezel area.

Figure 5:
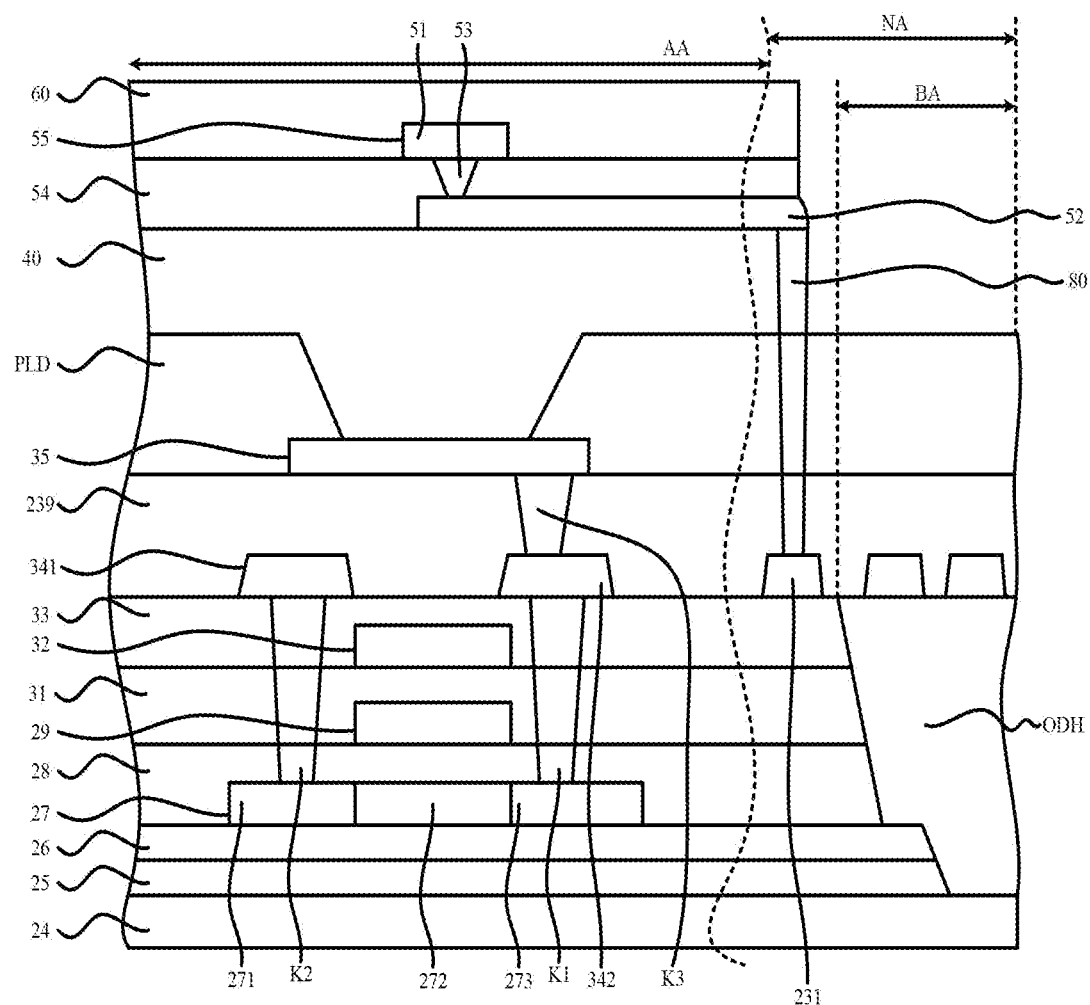
FIG. 5 is a cross-sectional view of the touch display panel of the embodiment of the present disclosure.

As shown in FIG. 5, in one embodiment, the touch display panel may include a display area AA and a non-display area NA disposed on one side of the display area AA. The non-display area NA includes a bending area BA.

The touch display panel includes a first polyimide flexible substrate 24, a buffer layer 25, a second polyimide flexible substrate 26, an active layer 27, an insulating layer 28, a first gate layer, a second gate insulating layer 31, a second gate layer, an interlayer insulating layer 33, a source-drain layer, an organic planarization layer 239, an anode layer, a pixel definition layer PLD, the encapsulation layer 40, a metal layer 54, a metal layer 55, and an organic insulating layer 60, which are sequentially stacked from bottom to top.

The active layer 27 includes a source electrode 271, an active region 272, and a drain electrode 273. The active region 272 is disposed between the source electrode 271 and the drain electrode 273. It can be understood that, in some embodiments, the source electrode 271 and the drain electrode 273 can be interchanged.

The first gate layer may include one or more first gates 29. The second gate layer may include one or more second gates 32.

The source-drain layer may include a source wiring 341, a drain wiring 342, and the touch wiring 231 disposed in the non-display area NA. The source wiring 341 is electrically connected to the source electrode 271 through a via hole K2. The drain wiring 342 is electrically connected to the drain electrode 273 through a via hole K1.

The anode layer may include one or more anodes 35. The anode 35 can be electrically connected to the drain wiring 342 through a via hole K3.

The metal layer 54 may include one or more touch traces 52. The metal layer 55 may include one or more touch electrodes 51. One touch electrode 51 can be electrically connected to one touch trace 52 through one or more via holes 53. The touch trace 52 can extend from the display area AA to the non-display area NA, but does not extend to the bending area BA. In the non-display area NA, the touch trace 52 can be electrically connected to the touch wiring 231 through the via hole 80. The via hole 80 may be disposed between the display area AA and the bending area BA. The via hole 80 may be close to an edge of the encapsulation layer 40, but does not contact with the encapsulation layer 40.

It should be noted that in the bending area BA, at least one of the buffer layer 25, the second polyimide flexible substrate 26, the active layer 27, the insulating layer 28, the first gate layer, the second gate insulating layer 31, the second gate layer, and the interlayer insulating layer 33 can be removed, and an organic material is filled to form an organic material filled area ODH. It is understandable that this is beneficial to improve the bending performance and a span life of the bending area.

Figure 6:
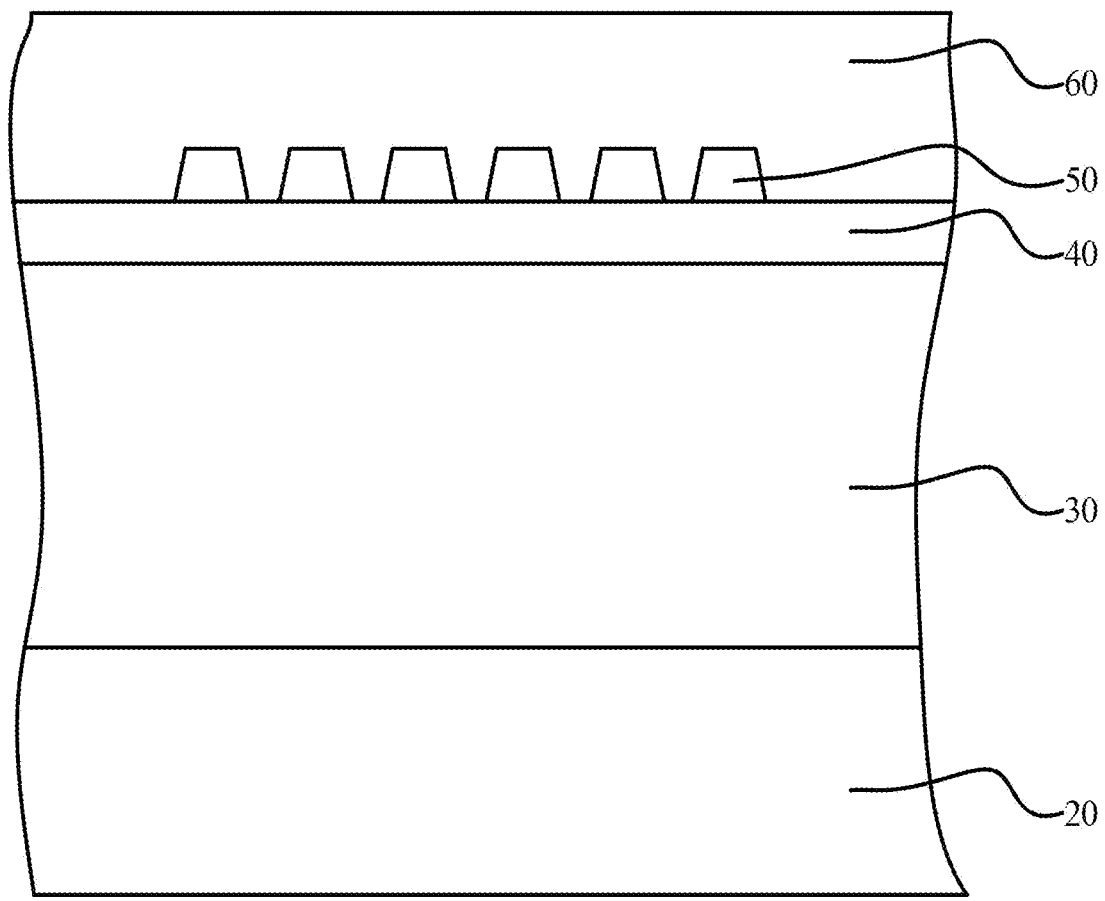
FIG. 6 is a schematic diagram of the touch display panel in a display area of the embodiment of the present disclosure.

As shown in FIG. 6, in one embodiment, the touch display panel further includes the encapsulation layer 40 and the organic insulating layer 60. The encapsulation layer 40 is disposed between the organic light emitting layer 30 and the touch function layer 50. The touch function layer 50 is disposed between the organic insulating layer 60 and the encapsulation layer 40. The encapsulation layer 40 is disposed in the display area and/or the first sub-bezel area.

Figure 7:
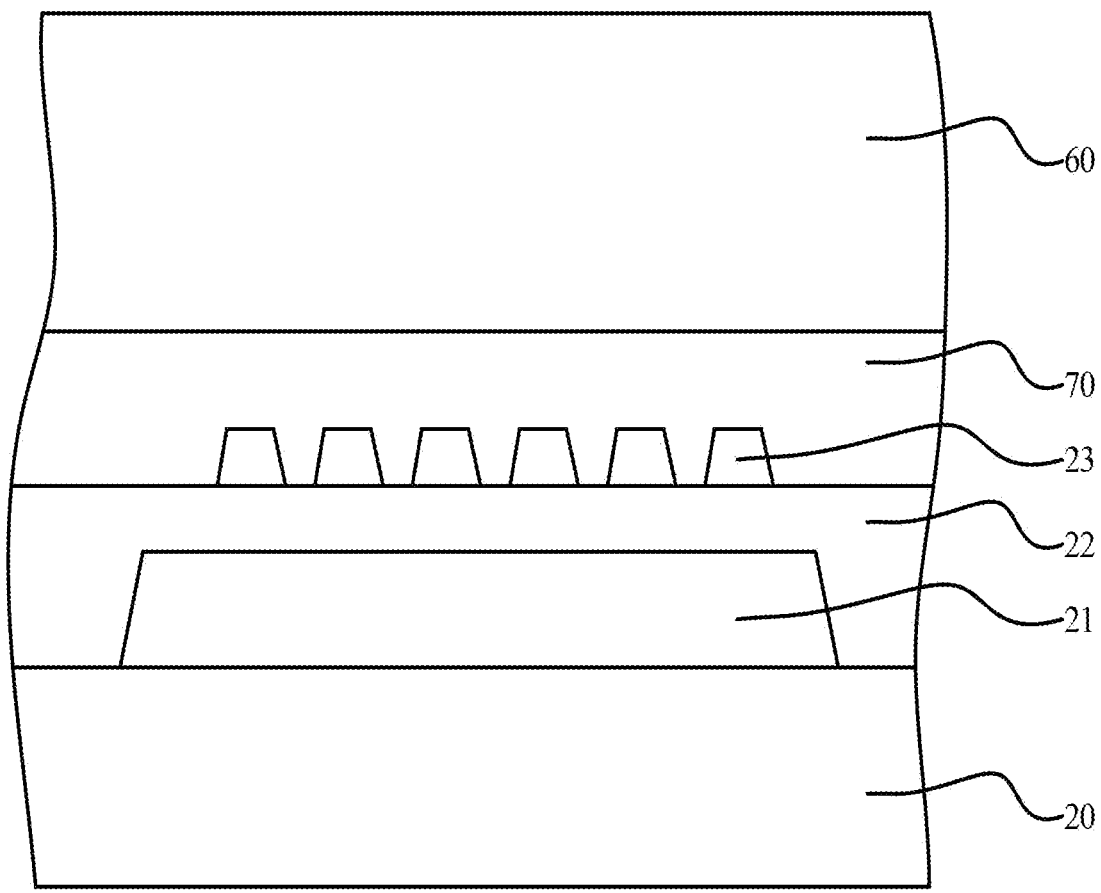
FIG. 7 is a schematic diagram of the touch display panel in a non-display area of the embodiment of the present disclosure.

As shown in FIG. 7, in one embodiment, the thin film transistor array layer 20 further includes a second metal layer 21 and a first organic planarization layer 22. The touch display panel also includes a second organic planarization layer 70 disposed in the non-display area. The first metal layer 23 is disposed between the first organic planarization layer 22 and the second organic planarization layer 70. The second metal layer 21 is disposed between the thin film transistor array layer 20 and the first organic planarization layer 22.

It is understandable that the encapsulation layer 40 may extend from the display area to the first sub-bezel area to solve a film layer difference between the display area and the non-display area of the touch display panel.

Specifically, this film layer difference is as follows. In the display area or the non-display area, the touch display panel may include the thin film transistor array layer 20, the organic light emitting layer 30, the encapsulation layer 40, the touch function layer 50, and the organic insulating layer 60 that are sequentially stacked. The thin film transistor array layer 20 in the display area includes the first polyimide flexible substrate, the buffer layer, the second polyimide flexible substrate, the active layer, the first gate insulating layer, the first gate layer, the second gate insulating layer, the second gate layer, the interlayer insulating layer, the first source-drain layer, the first organic planarization layer 22, and the second source-drain layer that are sequentially stacked.

In the non-display area or the display area, the touch display panel may also include the thin film transistor array layer 20, the second organic planarization layer 70, and the organic insulating layer 60 that are sequentially stacked. The thin film transistor array layer 20 in the non-display area includes the first polyimide flexible substrate, the buffer layer, the second polyimide flexible substrate, the first gate insulating layer, the second gate insulating layer, the interlayer insulating layer, the first source-drain layer, the first organic planarization layer 22, and the second source-drain layer that are sequentially stacked.

Through the above-mentioned differential comparison of film structures of the touch display panel in the display area and the non-display area, a reason for the difference in film thickness of the touch display panel in the display area and the non-display area can be obtained.

The first metal layer 23 may be any one of the first source-drain layer, the second source-drain layer, the first gate layer, and the second gate layer.

It should be noted that if the first metal layer 23 is the second source-drain layer, the via hole 80 extends through the second organic planarization layer 70, and the second source-drain layer is connected to the touch function layer 50 through the via hole 80.

It should be noted that if the first metal layer 23 is the first source-drain layer, the via hole 80 extends through the first organic planarization layer 22, the second source-drain layer, and the second organic planarization layer 70. The first source-drain layer is connected to the touch function layer 50 through the via hole 80.

It should be noted that if the first metal layer 23 is the second gate layer, the via hole 80 extends through the interlayer insulating layer, the first source-drain layer, the first organic planarization layer 22, the second source-drain layer, and the second organic planarization layer 70. The second gate layer is connected to the touch function layer 50 through the via hole 80.

It should be noted that if the first metal layer 23 is the first gate layer, the via hole 80 extends through the second gate insulating layer, the second gate layer, the interlayer insulating layer, the first source-drain layer, the first organic planarization layer 22, the second source-drain layer, and the second organic planarization layer 70. The first gate layer is connected to the touch function layer 50 through the via hole 80.

The second source-drain layer includes a plurality of second source-drain wiring. The first source-drain layer includes a plurality of first source-drain wirings. The second gate layer includes a plurality of second gate wirings. The first gate layer includes a plurality of first gate wirings. The first wiring may be any of the second source-drain wiring, the first source-drain wiring, the second gate wiring, and the first gate wiring.

It should be noted that the via hole 80 disposed in the bending area can be filled by the second organic planarization layer 70, which can further improve the bending performance of the bending area.

In one embodiment, the touch electrode 51 is formed on the touch function layer 50. The touch electrode 51 and the touch trace 52 are arranged on a same layer.

It should be noted that the touch electrode 51 and the touch trace 52 are arranged on the same layer, which can reduce a number of layers of the touch function layer 50 and simplify the manufacturing process of the touch function layer 50. Therefore, the film structure of the touch function layer 50 in this embodiment includes the touch layer. The manufacturing process of the touch display panel is as follows.

Figure 8:
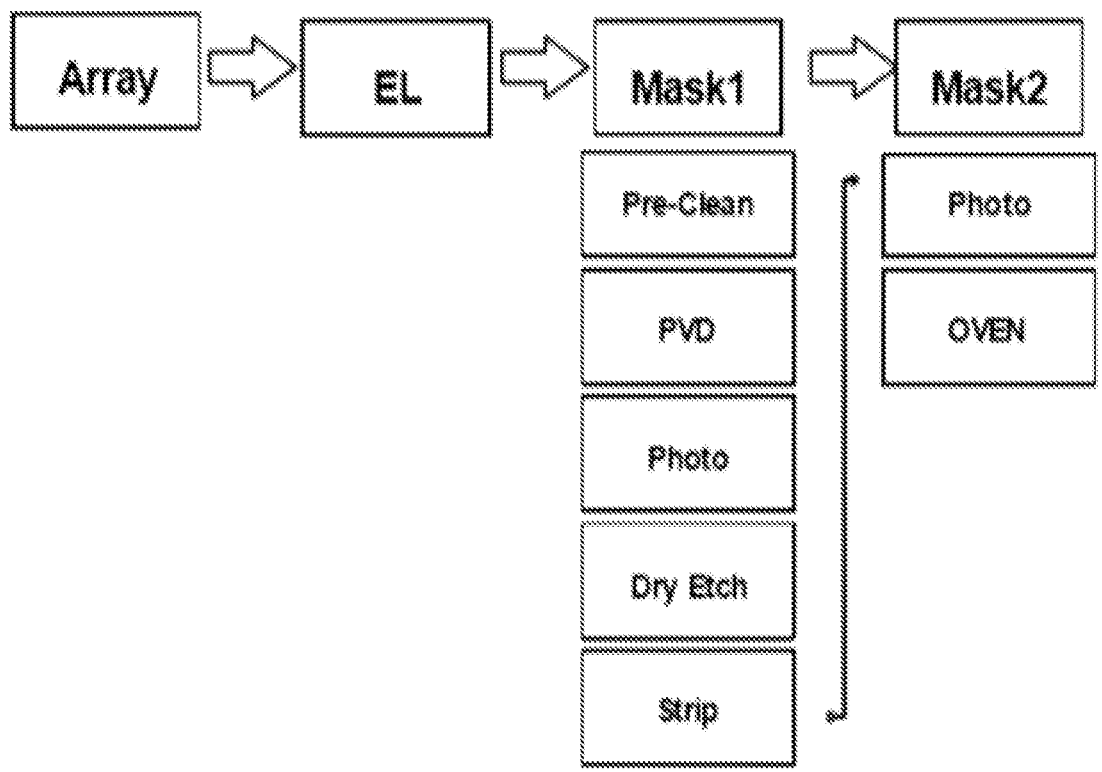
FIG. 8 is a flowchart of a manufacturing method of the touch display panel of the embodiment of the present disclosure.

As shown in FIG. 8, first, the first thin film transistor array layer 20 (Array) is generally formed, and then the organic light emitting layer 30 (EL) and the encapsulation layer 40 are formed. The touch electrode is formed on the encapsulation layer 40 through pre-cleaning (Pre-Clean), physical vapor deposition (PVD), photolithography (Photo), dry etching (Dry Etch), and stripping (Strip) processes in sequence. The organic insulating layer 60 is formed on the touch electrode layer through photolithography (Photo) and baking (OVEN) processes in sequence.

It can be understood that the touch function layer 50 in this embodiment adopts a self-capacitive touch. Therefore, a corresponding touch function can be realized with only a single film structure. This can not only reduce a corresponding process, but also save the use of corresponding equipment, thereby improving a production cycle of the touch display panel.

Figure 9:
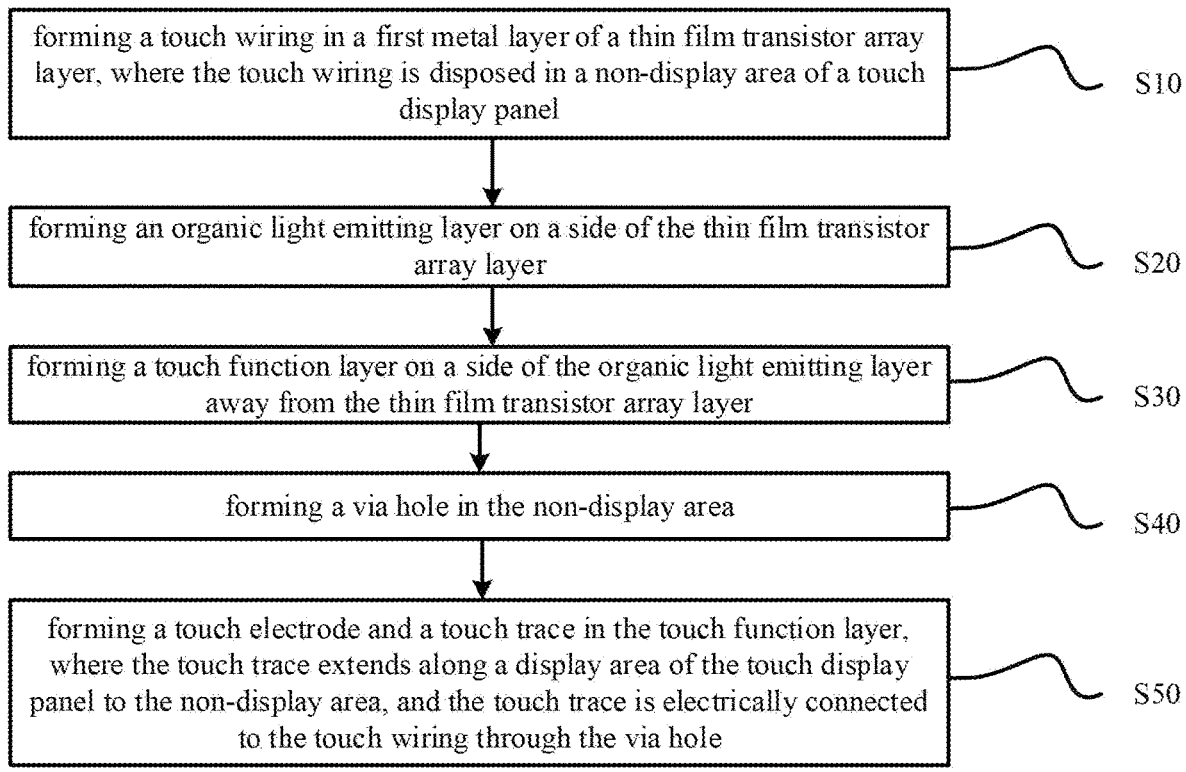
FIG. 9 is another flowchart of a manufacturing method of the touch display panel of the embodiment of the present disclosure.

As shown in FIG. 9, in one embodiment, the present disclosure provides a manufacturing method of a touch display panel, which includes the following steps.

In a step S10, a touch wiring 231 is formed in a first metal layer 23 of a thin film transistor array layer 20. The touch wiring 231 is disposed in a non-display area of a touch display panel.

In a step S20, an organic light emitting layer 30 is formed on a side of the thin film transistor array layer 20.

In a step S30, a touch function layer 50 is formed on a side of the organic light emitting layer 30 away from the thin film transistor array layer 20.

In a step S40, a via hole 80 is formed in the non-display area.

In a step S50, a touch electrode 51 and a touch trace 52 are formed in the touch function layer 50. The touch trace 52 extends along a display area of the touch display panel to the non-display area, and the touch trace 52 is electrically connected to the touch wiring 231 through the via hole 80.

It should be noted that the non-display area may be a bezel area on one side of the display area, for example, a lower bezel area.

It can be understood that the manufacturing method in this embodiment can use the manufacturing process of the thin film transistor array layer 20 to form the touch wiring 231 of the non-display area in the same layer. This solves the problem of poor etching of the touch wiring 231 due to the different substrate materials of the touch trace 52 in the display area and the touch wiring 231 in the non-display area.

In one embodiment, the present disclosure provides an electronic equipment, which includes the touch display panel in any of the above embodiments.

It can be understood that the electronic equipment in this embodiment can use the manufacturing process of the thin film transistor array layer 20 to form the touch wiring 231 of the non-display area in the same layer. This solves the problem of poor etching of the touch wiring 231 due to the different substrate materials of the touch trace 52 in the display area and the touch wiring 231 in the non-display area.

In one embodiment, the present disclosure provides an electronic equipment, which may be, but is not limited to, a mobile phone, and specifically may also be a foldable mobile phone.

In one embodiment, the touch display panel may be an organic light-emitting diode (OLED) display panel.

The OLED display panel is a display screen made of organic light-emitting diodes. Since it is equipped with self-luminous organic electroluminescent diodes, no backlight is required. The OLED display panel has excellent characteristics such as high contrast, thin thickness, wide viewing angles, fast response speeds, can be used for flexible panels, wide operating temperature ranges, simple structure and manufacturing process, and is considered to be the next-generation flat-panel display emerging application technology.

The organic light-emitting diode (OLED) displays are becoming more and more common, most widely used in products such as mobile phones, media players, and small entry-level TVs. Unlike standard liquid crystal displays, OLED pixels are driven by current sources.

The OLED uses organic materials that are suitable for chemical structure. The OLED technology requires a current control driving method. OLED has electrical characteristics quite similar to standard light-emitting diodes (LEDs), and its brightness depends on an LED current. To turn on and off the OLED and control the OLED current, thin film transistors (TFT) control circuits are required.

Advanced energy saving mode can achieve the highest efficiency. As with any battery-powered device, long battery standby time can only be achieved when a converter is operating at the highest efficiency of an overall load current range. This is especially important for OLED displays. The OLED display consumes the most power when displaying a full white image. For any other display colors, a current is relatively small. This is because only the white image requires all red, green, and blue sub-pixels to emit light. For example, a 2.7-inch display requires 80 mA of current to display the full white image, but only 5 mA of current is required to display other images. Therefore, an OLED power supply needs to achieve high converter efficiency for all load currents. In order to achieve such efficiency, it is necessary to use advanced energy-saving mode technology to reduce the load current, so as to reduce a switching frequency of the converter. Since this is realized through a voltage controlled oscillator (VCO), it can minimize possible electro-magnetic interference (EMI) problems and control the lowest switching frequency beyond a general audio range of 40 kHz. This prevents noise from ceramic input or output capacitors. This is especially important when using this type of device in mobile applications and can simplify a design process.

In terms of luminous characteristics, white light does not consume the most power, and power consumption is determined by a brightness value. For example, red, blue, and green lights with a brightness value of 10 will produce the white light with a brightness value of 30. Therefore, the red, blue, and green brightness values are adjusted to 3.3 to synthesize a white light value of 10 (theoretical value). From the perspective of LED or OLED, the human eye perceives the same brightness, and the blue light consumes the most power.

Organic light-emitting display technology consists of very thin organic material coating and glass substrate. The organic material emits light when electric charges pass. A color of OLED light depends on the material of the organic light emitting layer, so manufacturers can change the material of the light emitting layer to obtain the desired color. An active-matrix organic light emitting display has a built-in electronic circuit system, so each pixel is independently driven by a corresponding circuit. The OLED has advantages of simple structure, self-luminous without backlight, high contrast, thin thickness, wide viewing angles, fast response speeds, can be used for flexible panels, and wide operating temperature ranges. The technology provides the best way to browse photos and videos and imposes fewer restrictions on a design of a camera Complexity and information density of automobile information systems are increasing day by day. This makes an internal display of a vehicle no longer just a basic centralized instrument display, but to meet more and more detailed and diversified in-vehicle information display needs. Automotive displays are divided into vehicle navigation devices, vehicle TVs, and vehicle information systems by applications in the market.

The display products required by automotive electronics have high requirements for environmental adaptability. Performance indicators that are generally required for on-board display screens are: brightness 20 to 60 nit, lifespan at room temperature of 50,000 hours, and endurance temperature range of −40 to 85° C. In a North American automotive display market, vacuum fluorescent displays (VFDs) have long been popular because they have excellent brightness to ensure good visibility. However, with the rise of OLED and LCD liquid crystal display technologies, the VFD is gradually losing its advantages. Because of a high power consumption of VFD, full color and resolution are greatly restricted.

The LCD liquid crystal display technology has gradually begun to be applied in the field of vehicle displays. However, the liquid crystal display technology is subject to the influence of ambient temperature, which limits application fields of vehicle-mounted display products. Liquid crystal material used in the liquid crystal display will become liquid when the ambient temperature is too high, and will cool down and become crystal when the temperature is too low. No matter which state it becomes, the liquid crystal material no longer has a photoelectric effect that can be controlled by an electric field, causing the liquid crystal display to not work normally. In addition, the contrast, viewing angles, and response speeds of liquid crystal displays also vary with temperature. Therefore, for automotive displays with large environmental changes, liquid crystals are not the best display method.

In comparison with a mature TFT-LCD technology, the OLED technology is an active luminous display with high contrast, wide viewing angles (up to 170°), fast response time (about 1 μs), high luminous efficiency, low operation voltage (3 to 10V), ultra-light and thin (a thickness is less than 2 mm) and other advantages. Vehicle displays made with the OLED technology can have thinner thickness, attractive appearance, better color display quality, wider viewing ranges, and greater design flexibility. More importantly, an environmental adaptability of the OLED is far superior to that of the liquid crystal display, and a tolerable temperature of the OLED ranges from −40 to 85° C. In addition, OLED does not contain lead and will not pollute the environment. Therefore, OLED display applications have great advantages in the automotive field.

The OLED displays have brought huge advantages to automakers. They do not need to perforate wirings in the vehicle as in the past, and they can quickly install the automotive instrument panels and lighting system. Also, the OLED technology can bring a perfect experience to high-end luxury cars. The lifespan of OLED has been greatly improved. It has a lifespan of 40,000 to 50,000 hours in a normal environment, which is equivalent to that of TFT-LCD. For automotive display OLED products, the operating temperature range has reached −40 to 85° C. The lifespan of a monochrome product has reached 55,000 hours (70 nit) and 50,000 hours (80 nit). The working temperature of on-board chips is still improving.

Due to the above advantages, in a commercial field, the OLED displays can be applied to POS machines and ATM machines, copiers, game machines, etc. In the field of communications, the OLED displays can be applied to mobile phones, mobile network terminals, and other fields. In a computer field, the OLED displays can be widely used in PDAs, business PCs, home PCs, and notebook computers. In the field of consumer electronics, the OLED displays can be applied to audio equipment, digital cameras, and portable DVDs. In the field of industrial applications, the OLED displays are suitable for instruments and meters. In a transportation field, the OLED displays are used in GPS, aircraft instruments, etc.

The flexible screens refer to the flexible OLEDs. A successful mass production of the flexible screens is not only a major benefit to a manufacturing of a new generation of high-end smartphones, but also has a profound impact on applications of wearable devices due to its low power consumption and flexibility. In the future, flexible screens will be widely used with the continuous use of personal smart terminals.

A flexible screen mobile phone refers to a mobile phone with a bendable and flexible screen. Because it resembles a mango roll, it is also called a mango roll phone.

The OLED is very thin and can be disposed on flexible materials such as plastic or metal foil. Using plastic instead of glass will make the display more durable and lighter. The flexible OLED panel is concave from top to bottom, with a bending radius of up to 700 mm.

The OLED uses a plastic substrate instead of a common glass substrate. It uses a thin-film encapsulation technology, and a protective film is adhered to a back of the panel to make the panel bendable and not easy to break. The flexible screen can be rolled, but not folded. Future products should be foldable, and their appearance will change even more.

The display is cut from the panel. The bendable display, also known as the flexible display, is regarded as an initial product of a display revolution. An ultimate goal is to give a mobile and wearable electronic equipment a new look.

The OLED formation scheme is to use a vacuum evaporation technology to form an organic functional layer and a cathode layer. This requires expensive evaporation equipment, resulting in high production costs and low production efficiency. At the same time, limited by the size of the vacuum evaporation equipment, it is difficult to realize the formation of large-area display screens. In comparison with the vacuum thermal evaporation, a solution process has advantages of simple operation and low cost, and is suitable for low temperature or room temperature conditions, especially for manufacturing the large-size OLED screens. With a rapid iteration of organic electronics technology, a liquid-phase processing technology of soluble organic materials has become increasingly mature. The formation of OLEDs through the liquid phase method, especially printing process, is considered to be one of key methods to solve a bottleneck of an existing OLED development.

It can be understood that for those of ordinary skill in the art, equivalent replacements or changes can be made according to the technical solution of the present disclosure and its inventive concept. All these changes or replacements shall fall within the protection scope of the claims of the present disclosure.

What is claimed is:

1. A touch display panel, comprising a display area and a non-display area, wherein the touch display panel further comprises:
   a substrate;
   a thin film transistor array layer disposed on the substrate and comprising a plurality of thin film transistors;
   an organic light emitting layer disposed in the display area and disposed on a side of the thin film transistors away from the substrate; and
   a touch function layer disposed on a side of the organic light emitting layer away from the substrate, wherein the touch function layer comprises a touch electrode and a touch trace that are electrically connected, the touch electrode is disposed in the display area, and the touch trace extends along the display area to the non-display area; and
   wherein the thin film transistor array layer further comprises a first metal layer, the first metal layer comprises a first wiring disposed in the display area and a touch wiring disposed in the non-display area, the first wiring is electrically connected to the thin film transistor, and the touch wiring and the touch trace are electrically connected in the non-display area;
   wherein the non-display area comprises a first sub-bezel area, a bending area, and a second sub-bezel area that are sequentially arranged, and the first sub-bezel area is disposed between the display area and the bending area;
   wherein the touch display panel further comprises:
   a retaining wall disposed on a side of the thin film transistor array layer away from the substrate and disposed on the non-display area; and
   an encapsulation layer disposed between the organic light emitting layer and the touch function layer, wherein the encapsulation layer covers the light emitting layer in the display area and extends to cover the retaining wall in the non-display area; and
   wherein the touch trace and the touch wiring are electrically connected through a via hole, and the via hole is formed between the retaining wall and the bending area.

2. The touch display panel according to claim 1, wherein the thin film transistor array layer comprises a first gate insulating layer, a first gate layer, a second gate insulating layer, a second gate layer, an interlayer insulating layer, a first source-drain layer, a first organic planarization layer, and a second source-drain layer that are disposed on a side of the substrate and are stacked layer by layer; and wherein the touch display panel further comprises a second organic planarization layer, the second organic planarization layer is disposed between the thin film transistor array layer and the touch function layer, and the second source-drain layer is disposed far away from the substrate.

3. The touch display panel according to claim 2, wherein the first metal layer is the second source-drain layer, the via hole extends through the second organic planarization layer, and the via hole is connected to the second source-drain layer and the touch function layer.

4. The touch display panel according to claim 3, wherein the second source-drain layer comprises a plurality of second source-drain wirings, and the first wiring is one of the second source-drain wirings.

5. The touch display panel according to claim 2, wherein the first metal layer is the first source-drain layer, the via hole extends through the first organic planarization layer, the second source-drain layer, and the second organic planarization layer, and the via hole is connected to the first source-drain layer and the touch function layer.

6. The touch display panel according to claim 2, wherein the first metal layer is the second gate layer, the via hole extends through the interlayer insulating layer, the first source-drain layer, the first organic planarization layer, the second source-drain layer, and the second organic planarization layer, and the via hole is connected to the second gate layer and the touch function layer.

7. The touch display panel according to claim 2, wherein the first metal layer is the first gate layer, the via hole extends through the second gate insulating layer, the second gate layer, the interlayer insulating layer, the first source-drain layer, the first organic planarization layer, the second source-drain layer, and the second organic planarization layer, and the via hole is connected to the first gate layer and the touch function layer.

8. The touch display panel according to claim 1, wherein at least one of the touch electrode, the touch trace, and the touch wiring comprises a composite layer with Ti/Al/Ti material.

9. An electronic equipment, comprising the touch display panel according to claim 1.

10. The electronic equipment according to claim 9, wherein the touch wiring is formed through a high-temperature film forming process.

11. The electronic equipment according to claim 10, wherein the non-display area comprises a first sub-bezel area, a bending area, and a second sub-bezel area that are sequentially arranged, and the first sub-bezel area is disposed between the display area and the bending area;

wherein the touch display panel further comprises:
a retaining wall disposed on a side of the thin film transistor array layer away from the substrate and disposed on the non-display area; and
an encapsulation layer disposed between the organic light emitting layer and the touch function layer, wherein the encapsulation layer covers the light emitting layer in the display area and extends to cover the retaining wall in the non-display area; and
wherein the touch trace and the touch wiring are electrically connected through a via hole, and the via hole is formed between the retaining wall and the bending area.

12. The electronic equipment according to claim 11, wherein the thin film transistor array layer comprises a first gate insulating layer, a first gate layer, a second gate insulating layer, a second gate layer, an interlayer insulating layer, a first source-drain layer, a first organic planarization layer, and a second source-drain layer that are disposed on a side of the substrate and are stacked layer by layer; and wherein the touch display panel further comprises a second organic planarization layer, the second organic planarization layer is disposed between the thin film transistor array layer and the touch function layer, and the second source-drain layer is disposed far away from the substrate.

13. The electronic equipment according to claim 12, wherein the first metal layer is the second source-drain layer, the via hole extends through the second organic planarization layer, and the via hole is connected to the second source-drain layer and the touch function layer.

14. The electronic equipment according to claim 13, wherein the second source-drain layer comprises a plurality of second source-drain wirings, and the first wiring is one of the second source-drain wirings.

15. The electronic equipment according to claim 12, wherein the first metal layer is the first source-drain layer, the via hole extends through the first organic planarization layer, the second source-drain layer, and the second organic planarization layer, and the via hole is connected to the first source-drain layer and the touch function layer.

16. The electronic equipment according to claim 12, wherein the first metal layer is the second gate layer, the via hole extends through the interlayer insulating layer, the first source-drain layer, the first organic planarization layer, the second source-drain layer, and the second organic planarization layer, and the via hole is connected to the second gate layer and the touch function layer.

17. The electronic equipment according to claim 12, wherein the first metal layer is the first gate layer, the via hole extends through the second gate insulating layer, the second gate layer, the interlayer insulating layer, the first source-drain layer, the first organic planarization layer, the second source-drain layer, and the second organic planarization layer, and the via hole is connected to the first gate layer and the touch function layer.

18. The electronic equipment according to claim 10, wherein at least one of the touch electrode, the touch trace, and the touch wiring comprises a composite layer with Ti/Al/Ti material.

19. The electronic equipment according to claim 10, wherein the electronic equipment is a foldable mobile phone.

* * * * *